April 4, 1950 R. C. MARHOLZ 2,503,058

CONTROL APPARATUS FOR RADIO RECEIVERS

Filed April 6, 1946 2 Sheets-Sheet 1

INVENTOR.
RICHARD C. MARHOLZ
BY Mueller and Mason

ATTORNEYS

April 4, 1950 R. C. MARHOLZ 2,503,058

CONTROL APPARATUS FOR RADIO RECEIVERS

Filed April 6, 1946 2 Sheets-Sheet 2

INVENTOR.
RICHARD C. MARHOLZ
BY Mueller and Mason

ATTORNEYS

Patented Apr. 4, 1950

2,503,058

UNITED STATES PATENT OFFICE 2,503,058

CONTROL APPARATUS FOR RADIO RECEIVERS

Richard C. Marholz, Chicago, Ill., assignor to Belmont Radio Corporation, Chicago, Ill., a corporation of Illinois Application April 6, 1946, Serial No. 660,028

3 Claims. (Cl. 74—10.35)

The present invention relates to control apparatus for radio receivers or transmitters and more particularly to manually operable automatic tuners of the mechanical type for such receivers or transmitters. Specifically, the present invention is concerned with an improvement on U. S. Letters Patents 2,130,153, 2,154,406 and 2,172,288, all assigned to the same assignee as the present application.

Various push button actuated mechanical controlled devices are commercially available for selectively controlling the tuning elements of radio receivers. In general, such mechanical control devices or automatic tuners comprise a series of manually operable push buttons which enable the listener to selectively tune in particular stations merely by pushing or actuating the push buttons. In addition, the receiver usually includes manual means for tuning it to any other broadcasting station within the range of the receiver in addition to those for which the automatic tuning arrangement, including the push buttons, is set. In one form of automatic tuner for radio receivers, a series of variably positioned cams are provided along the shaft, one for each of the push bottons. Suitable means are provided for holding these cams in predetermined positions relative to the tuning shaft so that when a push button is actuated, its associated cam is rotated with the consequent rotation of the tuning shaft to a predetermined position corresponding to the particular station setting for which the push button and associated cam have been adjusted. In order initially to set the automatic tuning arrangement or to change the setting thereof, it is necessary to produce relative movement between the cam and the tuning shaft after which the cam is locked to the shaft in a perdetermined position relative thereto.

In the tuning arrangements disclosed in the above-mentioned patents, the cams or control members are positioned along the tuning shaft in between frictional means and suitable spacing sleeves are provided between the frictional means associated with adjacent cams or control means. The cams are locked to the shaft by applying a compressive force to the end of the stack of cams, frictional means, the spacers arranged on the tuning shaft and generally referred to as the cam stack, whereupon each cam is frictionally held between its frictional means, generally comprising a pair of washers, one on either side of the cam which are mounted on the shaft in such a manner that relative rotation with respect to the shaft is prevented. A suitable manually operable tuning knob at the end of the tuning shaft for rotating the same is commonly employed. Heretofore in order to apply a compressive force to the cam stack, it was general practice to provide a screw extending through the tuning knob. This screw was operable by means of a screw driver applied from the front of the tuning knob. Although this arrangement has been found to be very satisfactory, it is always necessary to employ tools such as a screw driver or the like both for initially tuning the set and to subsequently change these settings.

It is an object of the present invention to provide a new and improved automatic tuning arrangement in which no tools need be employed for changing the station settings as controlled by the push buttons.

It is another object of the present invention to provide an automatic tuning mechanism which can be set and reset merely by axial movement of the manually rotatable tuning knob without the requirement of extra tools or equipment.

It is a further object of the present invention to provide a new and improved manually operable automatic tuner for radio receivers having a plurality of control elements on a rotary shaft with the control elements adapted to be simultaneously locked to the control shaft solely by manipulation of a tuning knob.

Still another object of the present invention is to provide a new and improved automatic tuning mechanism in which axial movement of the tuning knob controls the pressure applied to the cam stack.

Further objects and advantages of the present invention will become apparent as the following description proceeds and the features of novelty which characterize the present invention will be pointed out with particularity in the claims annexed to and forming a part of this specification.

For a better understanding of the present invention, reference may be had to the accompanying drawings in which.

Although the present invention is adaptable for use with any apparatus employing tuning mechanisms such as radio receivers or radio transmitters, it is especially adaptable for use with radio receivers employing a relatively small cabinet, often referred to as a midget receiver and the invention has been specifically illustrated in connection with such application.

Figure 1:
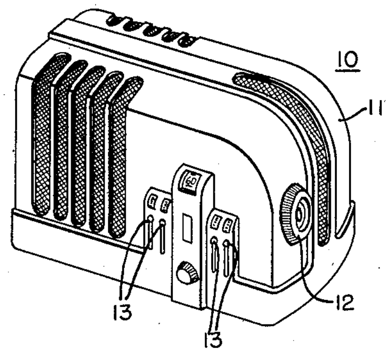
Fig. 1 is a perspective view of a radio receiving set embodying the present invention.

Referring now to the drawings, there is illustrated in Fig. 1 a radio receiver generally indicated at 10, comprising a cabinet 11 of any conventional style. A suitable tuning knob 12 is provided for manually tuning the receiving set 10 and in addition, a plurality of push buttons 13 are also provided which may be used to tune in certain specific stations to which the set is frequently tuned.

The tuning mechanism for the radio receiving set 10 of Fig. 1 comprises a rotary tuning shaft 14 which is suitably journalled in frame members 15 and 16 supported from a base member 17. The rotary shaft 14 which is provided with a longitudinally extending keyway 18, best shown in Figs. 2, 3 and 4 of the drawings, is coupled or otherwise suitably connected to a resonant frequency changing means or a frequency control device for tuning the radio receiver to particular stations. This resonant frequency changing means may comprise a variable inductance or a variable condenser and has been illustrated in Fig. 2 of the drawings as comprising a variable condenser 19 having a plurality of rotor plates 20 fixedly mounted for movement with the rotation of the shaft 14, and a plurality of stator plates 21. The rotor portion of condenser 19 is rotatable through an angle of substantially 180 degrees. Rotation of the tuning shaft 14 will cause the capacitance of the variable condenser 19 to vary with the resultant tuning of the radio receiving set 10 to any desired station within the range of the receiver. The tuning knob 12 mentioned above is associated with the shaft 14 at the end remote from the condenser 19 in a manner which will be described in greater detail hereinafter. In any event, rotation of the knob 12 causes rotation of the shaft 14.

In accordance with the now well-known automatic mechanical tuning mechanisms such as are disclosed in the above-mentioned patents, the shaft 14 is also controllable in so far as rotation thereof is concerned by the plurality of push buttons 13 mentioned above, whereby particular stations to which the listener frequently desires to listen may be tuned in merely by actuating one of the push buttons which automatically causes the desired location to be imparted to the shaft 14 without further effort than to actuate one of the push buttons.

Figure 2:
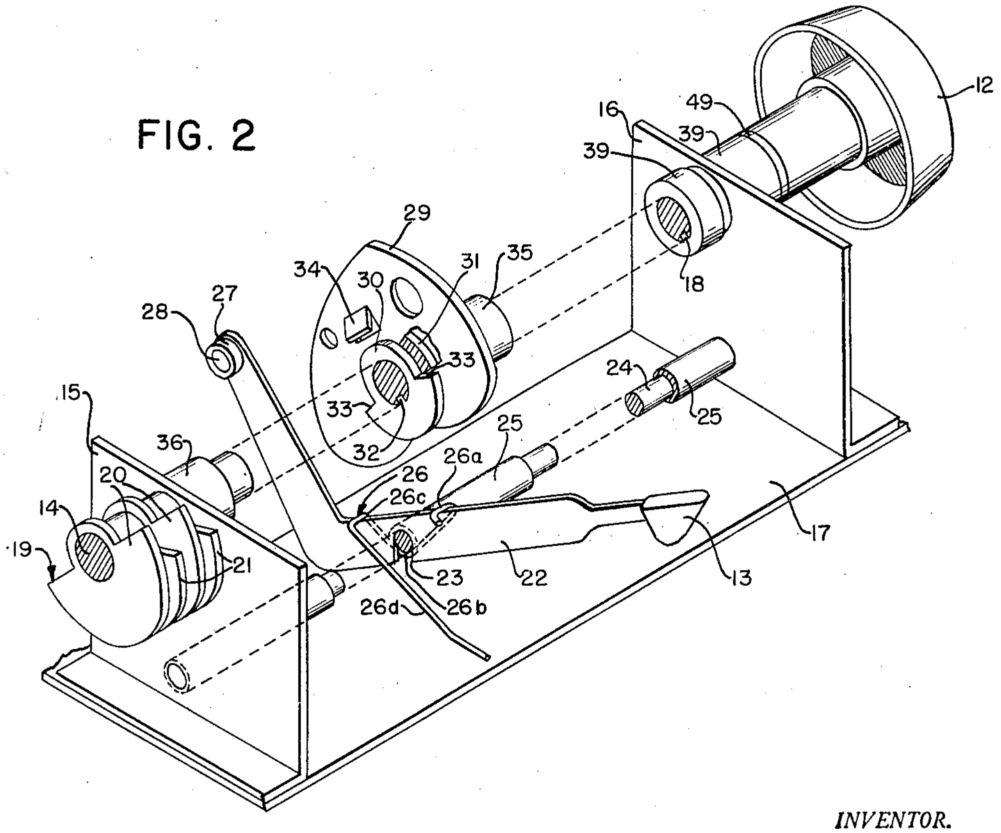
Fig. 2 is an enlarged perspective and somewhat schematic view partly in section of the tuning mechanism of the present invention employed in the receiving set of Fig. 1.

It should be understood that each push button 13 may be associated with a selector unit comprising a slidable member which is moved in a longitudinal direction upon the actuation of push button 13. As illustrated in the drawings, however, each of the push buttons 13, only one of which is shown in Fig. 2 thereof, is associated with an L-shaped lever or member 22 having a notched-out portion 23 adapted to be slipped over and pivotably mounted on a support or shaft 24 which in turn is supported between frame members 15 and 16. As was mentioned above, in order to simplify the disclosure, only one such push button and L-shaped member is shown in Fig. 2 of the drawings, but it will be understood that a series of such levers or members 22 will be provided along the support 24 which may be spaced in any desired manner, such as by suitable spacing sleeves 25. The portions of the shaft 14 and the support 24 which have been omitted from Fig. 2 of the drawings are shown in dotted lines and the associated push buttons and other members have been completely omitted.

In order to hold the L-shaped lever 22 in position for pivotable movement relative to the support 24, there is provided a spring member 26 which is of one piece, hairpinlike construction, comprising a hooked end 26*a* which extends over the top edge of the L-shaped lever 22 with a bowed retaining portion 26*b* passing beneath the support 24 and extending to a looped portion 26*c* hooked over the top edge of the L-shaped lever 22 to the rear of the support 24. The spring 26 is also provided with an extension 26*d* which engages the base 17 of the chassis to maintain the L-shaped lever 22 in the position indicated in Fig. 2 of the drawings except when a force is applied to the push button portion 13. The end of the L-shaped lever 22 remote from the push button 13 is provided with a roller 27 pivotably attached thereto by means of a pin or a stud 28. If desired, this roller 27 may be dispensed with and instead the end of the L-shaped lever 22 may be merely a rounded projection or the like.

In order that different desired station settings may be imparted to the tuning shaft 14 by means of the push buttons 13, the selector units comprising the series of L-shaped levers 22, only one of which is shown in Fig. 2 of the drawings, are each adapted to engage the edges of cooperating selecting or control members comprising heart-shaped cams 29. Each heart-shaped cam 29 is provided with an opening for accommodating the tuning shaft 14 and is normally held in a fixed relative position therewith, which position may be varied by means to be described hereinafter. Also, each cam 29 is positioned on shaft 14 so that the edges thereof are engageable by the roller 27 of its associated L-shaped lever 22. Furthermore, each of the cams 29 is positioned between a pair of washers 30 and 31 at least one of which is provided with a cooperating extension 32 for sliding in the keyway 18 whereby at least one of the washers 30 or 31 is non-rotatably positioned on the shaft 14. Preferably the washers 30 and 31 are identical and comprise a pair of shoulders 33 engageable with a stop lug 34 illustrated as a punched-out portion of the heart-shaped cam 29. This stop lug 34 is provided on only one side of cam 29 and serves to limit the relative movement of cam 29 and shaft 14 to substantially 180 degrees. It will be understood that the shoulders 33 need not be provided on the washer 31 since no stop lug is provided on that side of the cam 29. However, in order to keep the number of different parts of the apparatus at a minimum, it is preferable to employ identical washers 30 and 31 on either side of the cam 29 which washers provide the frictional means for locking or holding the cam 29 in a fixed position relative to the shaft 14.

In order that the cams 29 may be held in spaced relationship along shaft 14, suitable spacing means or sleeves 35 are provided between the washers 30 of one cam and the washer 31 of the adjacent cam. In addition, shaft 14 is provided with a stop member 36 near the end thereof adjacent to the variable condenser 19. The spacing means 35, the washers 30 and 31, and the cams 29 are assembled on the shaft 14 from the end remote from stop 36. All these members are rotatable about the shaft 14 except the washers 30 and 31 which are keyed against rotation by the portions 32 thereof. However, all of these members are longitudinally movable or slidable on shaft 14 and this stack of members generally referred to as the cam stack may be compressed against the stop member 36 whereby the frictional means comprising the washers 30 and 31 will firmly hold the associated cams 29 in a fixed non-rotatable position relative to the shaft 14.

Figure 3:
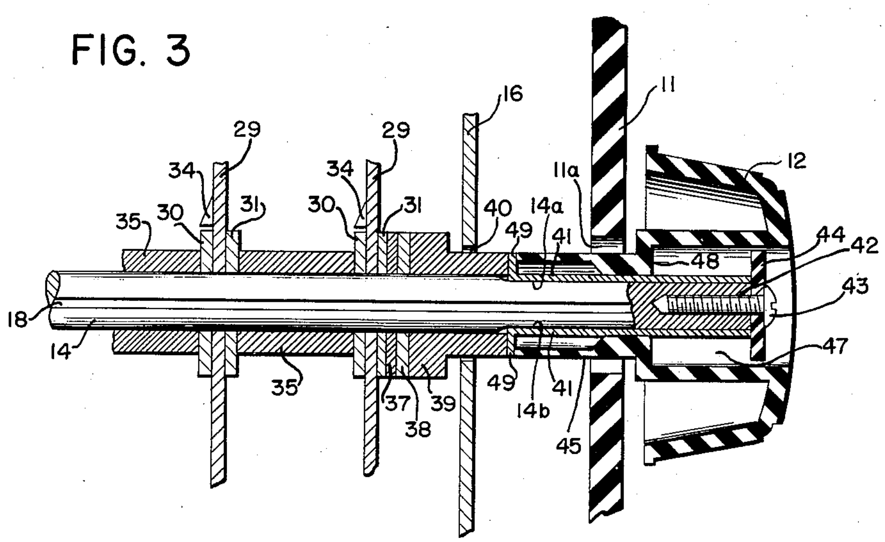
Fig. 3 is a sectional view of the tuning knob and a portion of the cam stack of Figs. 1 and 2 with the cam shown in a locked condition.
Figure 4:
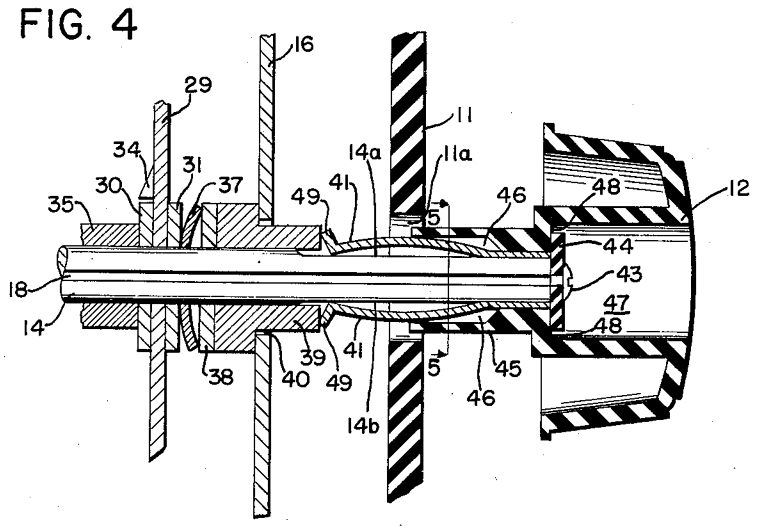
Fig. 4 is the sectional view similar to Fig. 3 showing the tuning knob and a portion of the cam stack with the cams in the unlocked condition to permit relative movement between the control members or cams and the tuning shaft.

In order to control the frictional means by compressing or releasing the cam stack comprising the cams, washers and spacing sleeves, there is provided adjacent to the end of the tuning shaft 14 remote from the stop member 36, as is best shown in Figs. 3 and 4 of the drawings, a spring washer 37, a washer 38 and a bushing 39 which has a portion of reduced cross-section adapted to fit into an opening 40 in the frame member 16. The members 37, 38 and 39 are mounted on the cam side of the frame member 16. In accordance with the present invention, suitable means are provided for compressing and releasing the cam stack solely in response to movement of the knob 12 relative to the shaft 14 and particularly with reference to axial movement of the knob 12. This means may comprise a U-shaped spring member or, as illustrated in the drawings, a pair of leaf spring members 41. To accommodate these leaf spring members 41, a portion of the shaft 14 at the end adjacent the knob 12 is provided with diametrically opposed flattened surfaces 14*a* and 14*b* which are illustrated as being displaced from the keyway 18 by 90 degrees. This portion of the shaft 14 having the flattened surfaces 14*a* and 14*b* extends through an opening 11*a* in the cabinet 11 whereby the knob 12 may be positioned outside the cabinet.

Figure 5:
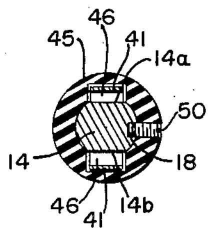
Fig. 5 is a sectional view taken on line 5—5 of Fig. 3.

To prevent the leaf springs 41 from moving along the flattened surfaces 14*a* and 14*b* of the shaft 14 in a direction away from the cam stack, the end of the shaft 14 is preferably provided with a threaded opening 42 to accommodate a screw 43 for holding a washer 44 against the end of the shaft 14 as is clearly shown in Figs. 3 and 4 of the drawings. Screw 43 and washer 44 may be formed of insulating material if desired, whereby the possibility of obtaining a shock through manipulation of tuning knob 12 is completely eliminated. The knob 12 is provided with a shank portion 45 and preferably the knob and shank are molded or otherwise formed from a suitable insulating material such as a plastic or the like. The shank 45 of the knob 12 is shaped so as to fit around the shaft 14 and a plurality of longitudinal recesses 46 are provided along part of the shank as is best shown in Fig. 5 of the drawings to accommodate the bowing action of the leaf springs 41 as will be described in greater detail hereinafter. The recesses 46 do not extend throughout the whole length of shank 45 as is obvious from Figs. 3 and 4 of the drawings, whereby the solid portion of the shank not provided with the recesses 46 holds the leaf springs against the flattened surfaces 14*a* and 14*b* of the shaft 14.

In order to limit the outward movement of the knob 12, it is provided with a large central recess 47, the bottom of which is provided with a shoulder portion 48 which engages with the washer 44 to limit the maximum axial movement of the knob 12 in a direction away from the cam stack as is shown in Fig. 4 of the drawings. The recess 47 permits relative movement between the washer 44 and the knob 12. When the knob 12 is in the position shown in Fig. 4 of the drawings, the leaf springs 41 are free to bow thereby being effectively shortened so that the cam stack may expand and the spring washer 37 may help to control the initial tension applied to the cam stack. When the knob 12 on the other hand is moved axially toward the cabinet 11, the portion of the shank 45 not provided with the recesses 46 forces the leaf springs 41 to move against the flattened surfaces 14*a* and 14*b* of the shaft 14, thereby effectively increasing the length thereof with the result that a sufficient pressure is applied to the cam stack to lock the cams 29 in fixed positions on shaft 14. This arrangement is shown in Fig. 3 of the drawings and it will be observed that the spring washer 37 is wholly compressed in this position. In order that the leaf springs 41 whose ends engage the washer 44 and the bushing 39 respectively may more uniformly distribute the force applied to the bushing 39, the ends thereof adjacent the bushing 39 are provided with substantially right angled extensions 49. The axial movement of the knob 12 in the direction toward the cam stack may be limited by any suitable means such, for example, as a raised portion on the shaft 14. In the drawings, this stop means is indicated as the right angled portions 49 which engage the end of the shank 45, the knob 12 being shown in its extreme inward position in Fig. 3 of the drawings.

In assembling the knob 12 and leaf springs 41, the leaf springs are placed on the shaft 14 and the knob 12 is slipped over the end of the shaft with the washer 44 and the screw 43 removed. The initial tension applied to the cam stack may then be adjusted by cutting the leaf springs to the proper length or by applying suitable shims to the end of shaft 14 between it and the washer 44. The initial tension should be such that the heart-shaped cams 29 will remain in a fixed position once they are adjusted, although they are relatively movable with respect to shaft 14 when an adjusting force is applied thereto as by actuation of the push buttons 13. When this initial tension is obtained and the washer 44 is fastened into position by means of screw 43, the cams 29 may be locked and unlocked merely by axial movement of knob 12, its two extreme positions being shown in Figs. 3 and 4 respectively of the drawings. In order to be sure that shaft 14 is rotated upon rotation of knob 12, it may be desirable to provide a suitable set screw such as is indicated at 50 in Fig. 5 of the drawings which extends through the shank 45 of the knob 12 and into engagement with the keyway 18. By employing a set screw such as 50 which still permits axial movement of the knob 12 rotation of shaft 14 is insured while permitting a fairly loose fit with shaft 14 to permit axial movement of knob 12.

It will be understood that various modifications of the spring means 41, the means for adjusting the initial tension and the stop means for limiting the axial movement of knob 12 may be employed. Several such modifications are disclosed in Royal Patent No. 2,450,918, issued October 12, 1948, assigned to the same assignee as the present application.

The operation of the tuning mechanism described thus far will be obvious in view of the detailed description included above. Assuming that the members defining the cam stack are in position on the tuning shaft 14 and the knob 12 is removed from the end of the shaft 14 which is accomplished by removing the screw 43 and the washer 44, the springs 41 are positioned on the flattened surfaces 14a and 14b of the shaft 14 and the shank 45 of the knob 12 which is next placed in position holds the springs. To provide the desired initial friction, which compresses the cam stack a predetermined amount, the springs 41 are either cut to the proper length as mentioned above, or shims are employed between shaft 14 and washer 44 which permit the ends of the springs 41 to extend beyond the end of shaft 14. It is desirable that this initial friction be such that the cams 29, although rotatable relative to the shaft 14, when a small force is applied thereto by means of L-shaped levers 22 will without such force remain in a fixed position relative to the shaft 14. As soon as this initial tension has been adjusted and the washer 44 and screw 43 fastened to the shaft 14, the tuning mechanism is in operative condition. When set screw 49 is inserted in shank 45, the tuning knob 12 may be rotated so as to tune in a particular broadcasting station. With the parts positioned as in Fig. 4 of the drawings, one of the push buttons 13 is then actuated so that the associated roller 27 moves into engagement with the low part of the cam 29 whereupon the cam 29 has assumed a predetermined position relative to shaft 14 which corresponds to the particular station to which the receiver is tuned. The associated push button 13 is then released and the tuning knob 12 may be rotated so that another station is tuned in. When this has occurred, another cam 29 on the shaft 14 may be moved in the manner described above to a predetermined position differing from the position of the first cam under consideration. This process is repeated until all the cams 29 on the tuning shaft 14 have been moved to different predetermined positions relative to the shaft 14. The cams 29 are then locked to the shaft 14 merely by moving the tuning knob 12 in an axial direction from the position shown in Fig. 4 of the drawings to the position shown in Fig. 3 thereof. The shank 45 causes the bowed portions of the leaf springs 41 of Fig. 4 to move against the shaft 14 so that the leaf springs become effectively longer with the resultant compression of the cam stack, the parts of which are moved axially toward the stop member 36. This compression force causes the washers 30 and 31 associated with each cam 29 to lock the respective cams in position. All the cams are locked in position simultaneously with the arrangement described above.

If the screw 43 and the washer 44 are made of insulating material, there is no conducting part of the tunable device extending outside of cabinet 11 which may be engaged by an operator whereby the possibility of receiving a shock is completely eliminated. Furthermore, the adjustment or setting of the cams 29 can be accomplished merely by limited axial movement of the tuning knob 12 without the requirement of any additional tools or equipment such as screw drivers or the like. Also, the present invention provides for a very foolproof construction which is simple to assemble and inexpensive to manufacture.

It will be apparent to those skilled in the art that the present invention is not limited to the particular construction shown, but various changes and modifications may be made without departing from the spirit and scope thereof, and it is aimed in the appended claims to cover all such changes and modifications as fall within the true spirit and scope of the present invention.

I claim:

1. A control device for a radio receiver including a rotary tuning shaft, a cam mounted on said shaft for relative movement therewith, frictional means for holding said cam in a predetermined fixed position on said shaft, said cam and frictional means comprising a cam stack axially slidable on said shaft, means for limiting the axial movement of said cam stack, a leaf spring positioned adjacent an end of said shaft and having one end thereof engaging said cam stack, means for effectively fixing the other end of said leaf spring to said shaft so that the center of said leaf spring is bowed away from said shaft, a tuning knob positioned on said end of said shaft for axial movement therewith, and a shank associated with said tuning knob for forcing the bowed portion of said spring against said shaft to compress said cam stack and effectively lock said cam to said shaft in response to axial movement of said knob in one direction.

2. A control device for a radio receiver including a rotary tuning shaft, a plurality of spaced cams mounted on said shaft for relative movement therewith, spacing and friction means intermediate said cams, said cams and spacing and friction means comprising a cam stack axially slidable on said shaft, means for limiting the axial movement of said cam stack, a pair of leaf springs positioned adjacent an end of said shaft in diametrically opposed relationship relative thereto and each having one end thereof engaging said cam stack, means for effectively fixing the other ends of said leaf springs to said shaft so that the centers of said leaf springs are bowed away from said shaft, a tuning knob positioned on said end of said shaft for axial movement therewith, and a shank associated with said tuning knob for forcing the bowed ends of said springs against said shaft to compress said cam stack whereby said friction means effectively lock said cams to said shaft in response to axial movement of said knob in one direction.

3. A control device for a radio receiver including a rotary tuning shaft, a cam mounted on said shaft for relative movement therewith, frictional means for holding said cam in a predetermined fixed position on said shaft, said cam and frictional means comprising a cam stack axially slidable on said shaft, means for limiting the axial movement of said cam stack, a leaf spring positioned adjacent an end of said shaft and having one end thereof engaging said cam stack, means for effectively fixing the other end of said leaf spring to said shaft so that the center of said leaf spring is bowed away from said shaft, a tuning knob positioned on said end of said shaft for axial movement therewith, a shank associated with said tuning knob for forcing the bowed portion of said spring against said shaft to compress said cam stack and effectively lock said cam to said shaft in response to axial movement of said knob in one direction, and means for limiting the axial movement of said knob.

RICHARD C. MARHOLZ.

REFERENCES CITED

The following references are of record in the file of this patent:

UNITED STATES PATENTS

| Number | Name | Date |
|---|---|---|
| 1,122,206 | Jennings | Dec. 22, 1914 |
| 2,200,211 | Benton | May 7, 1940 |
| 2,243,487 | Plensler | May 27, 1941 |